(12) United States Patent
Wongsenakhum et al.

(10) Patent No.: US 7,754,604 B2
(45) Date of Patent: Jul. 13, 2010

(54) REDUCING SILICON ATTACK AND IMPROVING RESISTIVITY OF TUNGSTEN NITRIDE FILM

(75) Inventors: Panya Wongsenakhum, Fremont, CA (US); Juwen Gao, San Jose, CA (US); Joshua Collins, Sunnyvale, CA (US)

(73) Assignee: Novellus Systems, Inc., San Jose, CA (US)

(*) Notice: Subject to any disclaimer, the term of this patent is extended or adjusted under 35 U.S.C. 154(b) by 539 days.

(21) Appl. No.: 11/349,035

(22) Filed: Feb. 6, 2006

(65) Prior Publication Data

US 2008/0045010 A1 Feb. 21, 2008

Related U.S. Application Data

(63) Continuation-in-part of application No. 10/649,351, filed on Aug. 26, 2003, now Pat. No. 7,141,494.

(51) Int. Cl.
*H01L 21/443* (2006.01)

(52) U.S. Cl. ............... 438/656; 438/680; 438/685; 257/E21.168

(58) Field of Classification Search ........... 257/E21.168
See application file for complete search history.

(56) References Cited

U.S. PATENT DOCUMENTS

| | | | |
|---|---|---|---|
| 4,746,375 A | 5/1988 | Lacovangelo |
| 4,804,560 A | 2/1989 | Shioya et al. |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |

(Continued)

FOREIGN PATENT DOCUMENTS

WO  WO01/27347  4/2001

OTHER PUBLICATIONS

Lee et al., PCT Search Report, Completed Oct. 15, 2004, PCT/US2004/006940, Int'l filing date May 3, 2004.

(Continued)

*Primary Examiner*—Stephen W Smoot
(74) *Attorney, Agent, or Firm*—Weaver Austin Villeneuve & Sampson LLP

(57) ABSTRACT

The present invention provides improved methods of depositing tungsten-containing films on substrates, particularly on silicon substrates. The methods involve depositing an interfacial or "flash" layer of tungsten on the silicon prior to deposition of tungsten nitride. The tungsten flash layer is typically deposited by a CVD reaction of a tungsten precursor and a reducing agent. According to various embodiments, the tungsten flash layer may be deposited with a high reducing agent to tungsten-precursor ratio and/or at low temperature to reduce attack by the tungsten precursor. In many cases, the substrate is a semiconductor wafer or a partially fabricated semiconductor wafer. Applications include depositing tungsten nitride as (or as part of) a diffusion barrier and/or adhesion layer for tungsten contacts.

20 Claims, 3 Drawing Sheets

U.S. PATENT DOCUMENTS

| | | | |
|---|---|---|---|
| 5,817,576 | A | 10/1998 | Tseng et al. |
| 5,926,720 | A | 7/1999 | Zhao et al. |
| 5,956,609 | A | 9/1999 | Lee et al. |
| 6,001,729 | A | 12/1999 | Shinriki et al. |
| 6,017,818 | A | 1/2000 | Lu |
| 6,037,263 | A | 3/2000 | Chang |
| 6,066,366 | A | 5/2000 | Berenbaum et al. |
| 6,099,904 | A | 8/2000 | Mak et al. |
| 6,107,200 | A | 8/2000 | Takagi et al. |
| 6,143,082 | A | 11/2000 | McInerney et al. |
| 6,174,812 | B1 | 1/2001 | Hsiung et al. |
| 6,206,967 | B1 | 3/2001 | Mak et al. |
| 6,245,654 | B1 | 6/2001 | Shih et al. |
| 6,265,312 | B1 | 7/2001 | Sidhwa et al. |
| 6,277,744 | B1 | 8/2001 | Yuan et al. |
| 6,294,468 | B1 | 9/2001 | Gould-Choquette et al. |
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,404,054 | B1 | 6/2002 | Oh et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B2 | 8/2003 | Chen et al. |
| 6,635,965 | B1 | 10/2003 | Lee et al. |
| 6,706,625 | B1 | 3/2004 | Sudijono et al. |
| 6,720,261 | B1 | 4/2004 | Anderson et al. |
| 6,740,585 | B2 | 5/2004 | Yoon et al. |
| 6,797,340 | B2 | 9/2004 | Fang et al. |
| 6,844,258 | B1 | 1/2005 | Fair et al. |
| 6,861,356 | B2 | 3/2005 | Matsuse et al. |
| 6,902,763 | B1 | 6/2005 | Elers et al. |
| 6,936,538 | B2 | 8/2005 | Byun |
| 6,939,804 | B2 | 9/2005 | Lai et al. |
| 6,962,873 | B1 | 11/2005 | Park |
| 7,005,372 | B2 | 2/2006 | Levy et al. |
| 7,141,494 | B2 | 11/2006 | Lee et al. |
| 7,157,798 | B1 | 1/2007 | Fair et al. |
| 7,262,125 | B2 | 8/2007 | Wongsenakhum et al. |
| 7,429,402 | B2 | 9/2008 | Gandikota et al. |
| 7,429,422 | B2 | 9/2008 | Davidson et al. |
| 7,589,017 | B2 | 9/2009 | Chan et al. |
| 7,655,567 | B1 | 2/2010 | Gao et al. |
| 2001/0008808 | A1 | 7/2001 | Gonzalez |
| 2001/0014533 | A1 | 8/2001 | Sun |
| 2001/0015494 | A1 | 8/2001 | Ahn |
| 2001/0044041 | A1 | 11/2001 | Badding et al. |
| 2002/0090796 | A1 | 7/2002 | Desai et al. |
| 2002/0177316 | A1 | 11/2002 | Miller et al. |
| 2003/0059980 | A1 | 3/2003 | Chen et al. |
| 2003/0104126 | A1 | 6/2003 | Fang et al. |
| 2003/0127043 | A1 | 7/2003 | Lu et al. |
| 2004/0044127 | A1 | 3/2004 | Okubo et al. |
| 2004/0206267 | A1 | 10/2004 | Sambasivan et al. |
| 2005/0136594 | A1 | 6/2005 | Kim |
| 2006/0094238 | A1* | 5/2006 | Levy et al. .................. 438/656 |
| 2009/0149022 | A1 | 6/2009 | Chan et al. |

OTHER PUBLICATIONS

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten for Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

Wongsenakhum et al., "Method of Forming Low-Resistivity Tungsten Interconnects", Novellus Systems, Inc., filed Mar. 31, 2004, U.S. Appl. No. 10/815,560, pp. 1-30.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

U.S. Office Action mailed Jun. 22, 2004, from U.S. Appl. No. 10/435,010.

U.S. Office Action mailed Mar. 23, 2005, from U.S. Appl. No. 10/690,492.

Lee et al., "Method for Reducing Tungsten Film Roughness and Improving Step Coverage", Novellus Systems, Inc., filed Aug. 26, 2003, U.S. Appl. No. 10/649,351, pp. 1-40.

Fair et al., "Selective Refractory Metal and Nitride Capping", Novellus Systems, Inc., filed Nov. 8, 2004, U.S. Appl. No. 10/984,126, pp. 1-22.

U.S. Office Action mailed Nov. 23, 2005, from U.S. Appl. No. 10/984,126.

Chan et al., "Methods for Growing Low-Resistivity Tungsten Film", Novellus Systems, Inc., filed Nov. 1, 2005, U.S. Appl. No. 11/265,531, pp. 1-35.

Levy et al., "Deposition of Tungsten Nitride", Novellus Systems, Inc., filed Dec. 16, 2005, U.S. Appl. No. 11/305,368, pp. 1-39.

U.S. Office Action mailed Dec. 28, 2005, from U.S. Appl. No. 10/815,560.

U.S. Office Action mailed Dec. 30, 2005, from U.S. Appl. No. 10/649,351.

Chan et al., "Methods for Growing Low-Resistivity Tungsten for High Aspect Ratio and Small Features," Novellus Systems, Inc., U.S. Appl. No. 12/030,645, filed Feb. 13, 2008.

Humayun et al., "Methods for Forming All Tungsten Contacts and Lines," Novellus Systems, Inc., U.S. Appl. No. 11/963,698, filed Dec. 21, 2007.

Chan et al., "Method for Improving Uniformity and Adhesion of Low Resistivity Tungsten Film," Novellus Systems, Inc., U.S. Appl. No. 11/951,236, filed Dec. 5, 2007.

Notice of Allowance and Fee Due mailed Mar. 12, 2003, from U.S. Appl. No. 09/975,074.

Allowed Claims from U.S. Appl. No. 09/975,074.

Notice of Allowance and Fee Due mailed Jul. 21, 2006, from U.S. Appl. No. 10/649,351.

Allowed Claims from U.S. Appl. No. 10/649,351.

Notice of Allowance and Fee Due mailed Oct. 7, 2004, from U.S. Appl. No. 10/435,010

Allowed Claims from U.S. Appl. No. 10/435,010.

Notice of Allowance and Fee Due mailed Aug. 25, 2006, from U.S. Appl. No. 10/984,126.

Notice of Allowance and Fee Due mailed Sep. 14, 2005, from U.S. Appl. No. 10/690,492.
Allowed Claims from U.S. Appl. No. 10/690,492.
Notice of Allowance and Fee Due mailed Apr. 24, 2007, from U.S. Appl. No. 10/815,560.
Allowed Claims from U.S. Appl. No. 10/815,560.
U.S. Office Action mailed May 17, 2006, from U.S. Appl. No. 10/984,126.
U.S. Office Action mailed Apr. 17, 2006, from U.S. Appl. No. 10/815,560.
U.S. Office Action mailed Sep. 28, 2006, from U.S. Appl. No. 10/815,560.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
U.S. Office Action mailed Jun. 27, 2008, from U.S. Appl. No. 11/305,368.
U.S. Office Action mailed Aug. 21, 2008, from U.S. Appl. No. 11/265,531.
Ashtiani et al., "Ternary Tungsten-Containing Thin Film Heater Elements," Novellus Systems, Inc., U.S. Appl. No. 61/025,237, filed Jan. 31, 2008.
Chen et al., "Method for Reducing Tungsten Roughness and Improving Reflectivity," Novellus Systems, Inc., U.S. Appl. No. 12/202,126, filed Aug. 29, 2008.
U.S. Office Action mailed Sep. 29, 2008, from U.S. Appl. No. 11/782,570.
U.S. Office Action mailed Apr. 3, 2009, from U.S. Appl. No. 11/305,368.
U.S. Final Office Action mailed Feb. 26, 2009, from U.S. Appl. No. 11/265,531.
Notice of Allowance and Fees Due mailed May 4, 2009, from U.S. Appl. No. 11/265,531.
Allowed Claims from U.S. Appl. No. 11/265,531, May 4, 2009.
U.S. Final Office Action mailed Apr. 28, 2009, from U.S. Appl. No. 11/782,570.
Chandrashekar et al., "Method for depositing thin tungsten film with low resistivity and robust micro-adhesion characteristics," Novellus Systems, Inc., U.S. Appl. No. 61/061,078, filed Jun. 12, 2008.
Ashtiani et al., "Ternary Tungsten-Containing Thin Films," Novellus Systems, Inc., U.S. Appl. No. 12/363,330, filed Jan. 30, 2009.
Chandrashekar et al., "Method for depositing thin tungsten film with low resistivity and robust micro-adhesion characteristics," Novellus Systems, Inc., U.S. Appl. No. 12/407,541, filed Mar. 19, 2009.
U.S. Office Action mailed Jun. 11, 2009, from U.S. Appl. No. 11/963,698.
Ken K. Lai and H. Henry Lamb, Precursors for Organometallic Chemical Vapor Deposition of Tungsten Carbide Films, 1995, Chemistry Material, pp. 2284-2292.
U.S. Office Action mailed Jun. 24, 2009 from U.S. Appl. No. 12/030,645.
U.S. Office Action mailed Aug. 5, 2009 from U.S. Appl. No. 11/951,236.
U.S. Office Action mailed Oct. 21, 2009 from U.S. Appl. No. 12/202,126.
U.S. Notice of Allowance mailed Nov. 17, 2009 from U.S. Appl. No. 11/305,368.
Allowed Claims for U.S. Appl. No. 11/305,368, Feb. 2010.
U.S. Final Office Action mailed Dec. 9, 2009 from U.S. Appl. No. 11/963,698.
U.S. Notice of Allowance mailed Sep. 17, 2009 from U.S. Appl. No. 11/782,570.
Allowed Claims from U.S. Appl. No. 11/782,570, Feb. 2010.
Chan et al., "Methods for Growing Low-Resistivity Tungsten Filml", Novellus Systems Inc., U.S. Appl. No. 12/538,770, filed Aug. 10, 2009.
U.S. Final Office Action mailed Jan. 13, 2010 from U.S. Appl. No. 12/030,645.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Dec. 11, 2009, U.S. Appl. No. 12/636,616.
U.S. Final Office Action mailed Jan. 26, 2010 from U.S. Appl. No. 11/951,236.

* cited by examiner

REDUCING SILICON ATTACK AND IMPROVING RESISTIVITY OF TUNGSTEN NITRIDE FILM

CROSS-REFERENCE TO RELATED PATENT APPLICATIONS

This application is a continuation-in-part of U.S. application Ser. No. 10/649,351, now issued as U.S. Pat. No. 7,141,494, filed Aug. 26, 2003, entitled METHOD FOR REDUCING TUNGSTEN FILM ROUGHNESS AND IMPROVING STEP COVERAGE which is incorporated herein by reference in its entirety. This application is related to the following: U.S. application Ser. No. 09/975,074 (issued as U.S. Pat. No. 6,635,965) filed Oct. 9, 2001, entitled ULTRA THIN TUNGSTEN LAYER WITH IMPROVED STEP COVERAGE, U.S. patent application Ser. No. 10/690,492, (issued as U.S. Pat. No. 7,005,372) filed Oct. 20, 2003, entitled DEPOSITION OF TUNGSTEN NITRIDE FILM, U.S. patent application Ser. No. 10/815,560, (issued as U.S. Pat. No. 7,262,125) filed Mar. 31, 2004, entitled METHOD OF FORMING LOW-RESISTIVITY TUNGSTEN INTERCONNECTS and U.S. patent application Ser. No. 11/265,531, filed Nov. 1, 2005, entitled METHOD FOR GROWING LOW RESISTIVITY TUNGSTEN FILM.

FIELD OF THE INVENTION

This invention pertains to methods for depositing tungsten-containing films. Specifically, the invention pertains to methods that deposit tungsten-containing films on partially fabricated semiconductor devices. The invention is particularly useful for applications that require tungsten nitride deposition on silicon with good adhesion, excellent step coverage, and low resistivity.

BACKGROUND

Tungsten-containing films are used in multiple applications for semiconductor device fabrication. For example, metallic tungsten is the primary conductor for contacts and vias. Although the typical film stack in use today is PVD-Ti/CVD-TiN/W nucleation/CVD-W, tungsten nitride's relatively low resistivity, good adhesion to dielectric films, and good diffusion barrier properties makes it desirable as a replacement for Ti/TiN. Standard tungsten nitride CVD techniques adequately fill low aspect ratio features, while for higher aspect ratios, pulsed nucleation layer (PNL) techniques may be used. Both CVD and PNL processes involve exposing the partially fabricated semiconductor device to a tungsten precursor (typically tungsten hexafluoride ($WF_6$). Conventional CVD involves the simultaneous introduction of gas phase reactants, including the tungsten precursor (typically tungsten hexafluoride ($WF_6$)) and a nitrogen containing gas (e.g., $N_2$), near a heated wafer surface. PNL techniques typically involve reacting the tungsten precursor with an adsorbed layer of a reducing agent to form a metallic tungsten layer, then nitriding this layer.

One difficulty in replacing Ti/TiN with WN on silicon is that the $WF_6$ precursor commonly used to deposit WN may attack the silicon, forming defects. Deposition of other tungsten-containing layers on silicon presents the same difficulties.

What are therefore needed are improved methods for depositing tungsten-containing layers on silicon that reduce or eliminate defects in the silicon.

SUMMARY OF THE INVENTION

The present invention meets these needs by providing improved methods of depositing tungsten-containing films on substrates, particularly on silicon substrates. The methods involve depositing an interfacial or "flash" layer of tungsten on the silicon prior to deposition of tungsten nitride. The tungsten flash layer is typically deposited by a CVD reaction of a tungsten precursor and a reducing agent. According to various embodiments, the tungsten flash layer may be deposited with a high reducing agent to tungsten-precursor ratio and/or at low temperature to reduce attack by the tungsten precursor. Also according to various embodiments, deposition of the flash layer may be followed by pulsed nucleation layer (PNL) deposition of tungsten nitride, which in turn may be followed by CVD deposition of tungsten. In many cases, the substrate is a semiconductor wafer or a partially fabricated semiconductor wafer. The invention may be used in any application for which it is desirable to deposit tungsten nitride on a silicon substrate, including but not limited to using tungsten nitride as (or as part of) a diffusion barrier and/or adhesion layer for tungsten contacts.

One aspect of the invention relates to a method of forming a tungsten-containing layer on a substrate. The method involves the steps of a) exposing the substrate to tungsten-containing precursor and a reducing agent to deposit a tungsten flash layer by chemical vapor deposition at low temperature and b) depositing the tungsten-containing layer on the flash layer. Low temperature refers to temperatures less than about 350 C, and in specific embodiments, less than about 300 C, less than about 250 C, and around 200 C. According to various embodiments, the tungsten flash layer is between about 5-100 angstroms, more preferably between about 5-50 angstroms, and most preferably about 10-35 angstroms. In preferred embodiments, the substrate contains exposed silicon and the flash layer is deposited on at least a portion of the exposed silicon. The ratio of reducing agent:tungsten-containing precursor is step (a) is preferably between about 2:1 and 4:1.

In some embodiments, the substrate is exposed to the reducing agent for a period of time prior to introducing the tungsten precursor to the chamber.

According to various embodiments, the tungsten-containing layer may be a tungsten nitride layer or a metallic tungsten layer. In preferred embodiments, the layer is a tungsten nitride layer preferably deposited by a PNL process. In some embodiments, the method further includes forming a metallic tungsten layer over the tungsten nitride layer.

Another aspect of the invention method relates to forming a tungsten nitride layer on a substrate. The method involves the steps of (a) exposing the substrate to reducing agent and tungsten-containing precursor gases in order to deposit a tungsten flash layer of between 5 and 100 A on the substrate surface by chemical vapor deposition; and (b) depositing a tungsten nitride layer on the flash layer.

In preferred embodiments, the tungsten nitride layer is deposited by a pulsed nucleation process. Also in preferred embodiments, the substrate comprises exposed silicon and the flash layer is deposited on at least a portion of the exposed silicon. In particularly preferred embodiments, the method includes forming a metallic tungsten layer on the tungsten nitride layer to form a silicon contact comprised of the flash layer, tungsten nitride layer and metallic tungsten layer.

Another aspect of the invention relates to a method of depositing a tungsten flash layer that involves the steps of: positioning the substrate having exposed silicon in a chamber; flowing reducing agent and tungsten-containing precursor gases by divert to stabilize the flow; flowing the reducing agent into the chamber for a period of time prior to flowing the tungsten-containing precursor; flowing the reducing agent and tungsten-precursor into the chamber to deposit a tungsten flash layer of between 5 and 50 angstroms on the exposed silicon by chemical vapor deposition; wherein the substrate temperature is about 350 or less during deposition of the flash layer; stopping reducing agent and tungsten precursor flows; and pumping out the chamber.

A further aspect of the invention relates to semiconductor devices or partially fabricated semiconductor devices having a flash layer over a silicon substrate and tungsten nitride layer contacting the tungsten flash layer. In some embodiments, the device further comprises a bulk metallic tungsten layer over the tungsten nitride layer.

DETAILED DESCRIPTION

Introduction

Figure 1:
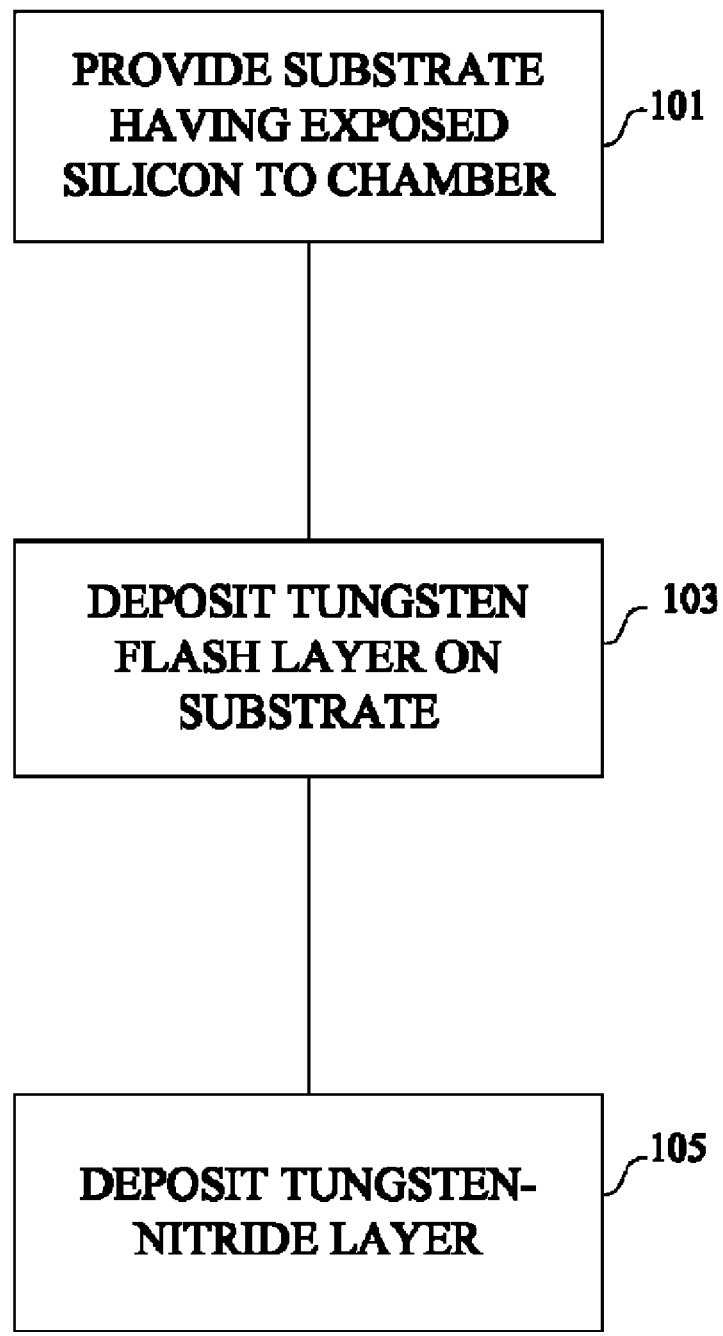
FIG. 1 is a process flow diagram illustrating relevant operations employed in certain embodiments of the present invention.

As indicated, the present invention provides methods for depositing tungsten-containing layers, especially for applications in which the tungsten-containing layer is deposited over silicon surfaces and wherein thin, conformal and adhesive layers are required. The present invention also provides methods of depositing tungsten-containing films over Ti/TiN films and other substrates.

Deposition of tungsten-containing films by methods such as pulsed nucleation layer (PNL), atomic layer deposition (ALD) and chemical vapor deposition (CVD) on silicon involves use of a tungsten precursor, often $WF_6$. At the conditions typically used for deposition, the substrate surface may be susceptible to attack by the tungsten precursor. For example, deposition of a tungsten nitride film by PNL involves reacting a tungsten precursor with an adsorbed layer of a reducing agent. Typical PNL deposition temperatures are around 300 C. At this temperature and other PNL processing conditions, the silicon substrate is susceptible to attack by the tungsten precursor, causing defects in the silicon. Defects in silicon (e.g. polysilicon gates or silicon sources/drains) may lead to open circuits and device failure. The silicon is especially susceptible to attack by $WF_6$ when the deposition temperature is relatively high. Thus, deposition of tungsten-containing films by conventional CVD methods, for which temperatures are typically around 400 C, also may lead to attack by the tungsten precursor.

Thus, in some embodiments, the present invention provides methods of depositing tungsten-containing layers that prevent or reduce attack by the tungsten precursor. The methods involve depositing a tungsten flash layer prior to depositing the tungsten-containing layer. The flash layer is typically deposited by CVD deposition of a tungsten precursor, e.g. $WF_6$, and a reducing agent such as silane. In depositing the flash layer, the deleterious effect of $WF_6$ are eliminated by performing the process at low temperature and/or using a high reducing agent:tungsten precursor ratio. In some embodiments, the reducing agent is flowed into the reaction chamber for a period of time prior to the introduction of the tungsten precursor. The tungsten precursor and reducing agent are then flowed for a period of time to deposit a tungsten layer of about 5-100 angstroms thick.

Once the flash layer is deposited, other processes involving tungsten precursors may be implemented. In a preferred embodiment, tungsten nitride is deposited by a PNL process as described in U.S. patent application Ser. No. 10/690,492, referenced above. However, the tungsten nitride may be deposited by CVD or other method that also requires use of a tungsten precursor.

Although the description refers largely to the deposition of tungsten nitride on silicon, the tungsten flash layer may also be optimally used in other processes where silicon is susceptible to attack by a tungsten precursor, for example, in the deposition of metallic tungsten layers by PNL, ALD or CVD. One of skill in the art will understand how to modify the processes described to deposit the desired tungsten-containing layers given the description provided herein. Regardless of the composition of the overlying layer or the method used to deposit it, the flash layer protects the silicon substrate from attack by the tungsten precursor during the deposition.

In alternate embodiments, the substrate surface contains a material other than silicon that is susceptible to attack by the tungsten-containing precursor during conventional PNL, ALD or CVD deposition of the tungsten-containing film. For example, a flash layer may be used to protect a Ti/TiN layer on which it is desired to deposit a bulk tungsten layer. Similarly, the substrate surface may be made of any other film that is susceptible to attack. Still further, the flash layer may be used in some embodiments to reduce stack resistivity, for example, of a WN stack.

Process Flow

A general process flow for the deposition of tungsten nitride according to one embodiment of the present invention is shown in the flowchart of FIG. 1, which shows the formation of a tungsten-containing layer. First, a substrate surface containing exposed silicon is provided as indicated at 101. For many embodiments of the invention, the areas of exposed silicon comprise sources, drains or gate electrodes of partially fabricated integrated circuits. The exposed silicon may be monocrystalline or polycrystalline (polysilicon).

On the substrate surface, the process forms a tungsten metal flash layer at step 103. As is discussed more fully below with reference to FIG. 2, this is accomplished by a CVD reaction of a tungsten precursor (also referred to as a tungsten-containing precursor) and a reducing agent at process conditions that reduce or eliminate the deleterious effects of the tungsten precursor on the substrate surface.

After the flash layer is formed on the substrate surface, tungsten nitride is deposited at step 105 by a method such as PNL, ALD or CVD. Although not depicted in the figure, in some embodiments metallic tungsten metal is deposited on the flash layer, for example, where the flash layer overlies a Ti/TiN barrier layer. Examples of other tungsten-containing films that may be deposited on the flash layer include tungsten silicides.

As described in above reference U.S. patent application Ser. No. 10/690,492, tungsten nitride layers may be used to replace traditional Ti/TiN film stacks. PNL and ALD processes are used to deposit the thin, highly conformal films that may be required for this and other applications. PNL deposition of tungsten nitride films involves exposing the substrate to alternating pulses of a reducing agent, a tungsten precursor and a nitrogen-containing compound. In some embodiments, the reducing agent may be introduced to the substrate to form an adsorbed or saturated layer prior to introducing the tungsten precursor. The tungsten precursor is then introduced to react with the adsorbed layer and form tungsten. Alternatively, the tungsten precursor is introduced to the substrate before the reducing agent. In this case, a thin layer of tungsten precursor forms on the substrate and is subsequently decomposed to form tungsten upon contact with the reducing agent. The tungsten layer is then converted to tungsten nitride by contact with a nitriding agent. Generally, one wants all of the tungsten deposited in step 105 to be converted to tungsten nitride. Typically, a very thin layer of tungsten metal is deposited by PNL so that the entire layer may be nitrided in a single nitridation operation. In some embodiments, some or all of the flash layer may be nitrided in the nitridation operation.

In preferred embodiments, the thickness of the tungsten nitride layer ranges from 20-50 angstroms for contact applications. After depositing the tungsten nitride layer film at step 105, other layers may be deposited as required for the particular application. For example, a tungsten metal layer may be deposited on a tungsten nitride layer deposited in step 105.

Figure 2:
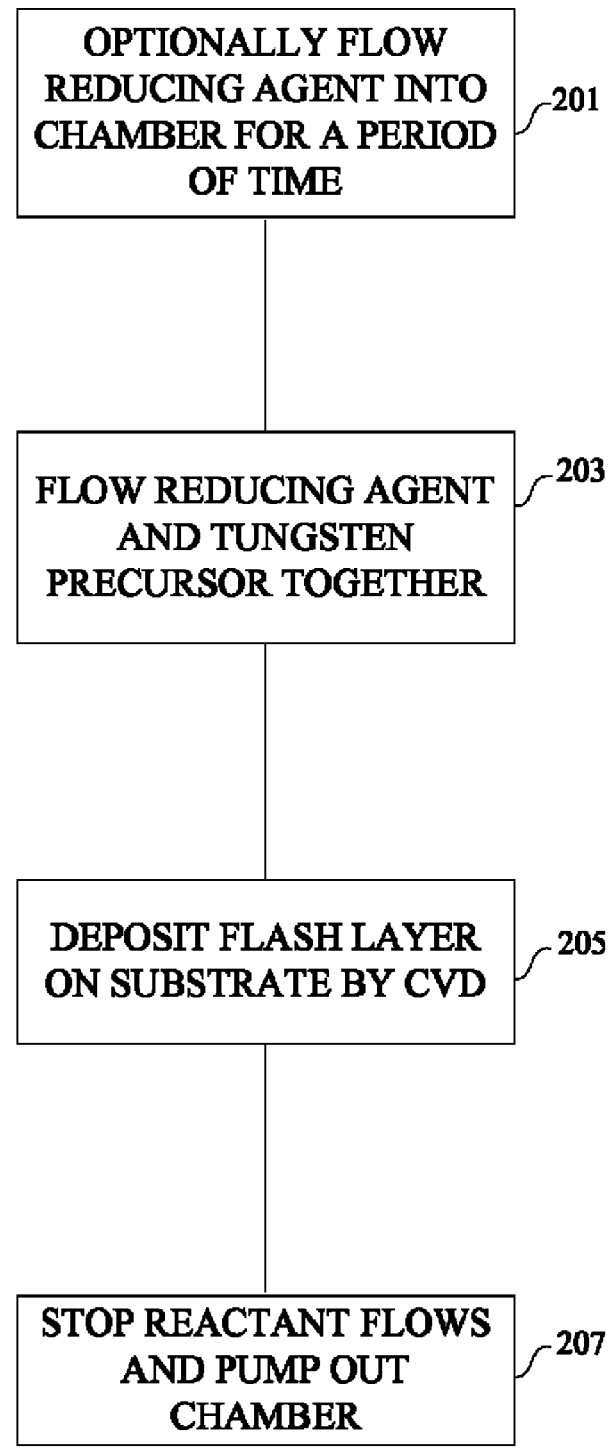
FIG. 2 is a process flow diagram illustrating relevant operations employed in depositing a flash layer onto a substrate.

FIG. 2 is a flow chart showing a general process for depositing the flash layer. First, in step 201, the reducing agent is optionally flowed for a period of time prior to flowing the tungsten precursor. This step is performed in certain embodiments to protect the substrate from the tungsten precursor in the subsequent step. The reducing agent is flowed for a period of time long enough to cover the wafer, for example, for 2-10 seconds. Flow rate of the reducing agent may range, in some embodiments, from about 100-300 sccm.

In step 203, the reducing agent and the tungsten-containing precursor are flowed together. The process then deposits the tungsten flash layer by CVD at step 205. After the desired thickness of tungsten is deposited, the reactant flows are stopped and the chamber is pumped out at step 207.

The reducing agent can be any process-compatible compound capable of effectively reducing a tungsten precursor to produce a layer of metallic tungsten. Examples of suitable reducing agents include silicon hydrides such as silane and organic derivatives thereof. Other reducing agents include various boron-containing reducing age its, preferably boranes such as borane ($BH_3$), diborane ($B_2H6$), triborane, etc. Examples of other boron-containing reducing agents include boron halides (e.g. $BF_3$, $BCl_3$) with hydrogen. In a preferred embodiment, silane or silane derivative is used.

Any suitable tungsten precursor that can be reduced by the reducing agent to deposit a layer of tungsten metal in accordance with the invention can be used. Examples of suitable tungsten precursors include $WF_6$, $WCl_6$, $W(CO)_6$, and combinations of these. Various other tungsten precursors known to those of skill in the art may be used. Some of these are identified in R. G. Gordon, J. Barton, and Seigi Suh in *Materials, Technologies, and Reliability for Advanced Interconnects and Low-K Dielectrics II*, edited by S. Lahiri, (Mat. Res. Soc. Proc. 714E, Pittsburgh Pa., 2001), which is incorporated herein by reference for all purposes. In a preferred embodiment, the tungsten precursor is $WF_6$.

Generally speaking, the ratio reducing agent: tungsten-containing precursor should be relatively high to reduce or eliminate deleterious effects of the tungsten precursor on the substrate surface. Typical ratios may range from 2:1-10:1. In preferred embodiments, the ratio ranges from 2:1 to 4:1, and even more preferably the ratio is 3:1. In a particularly preferred embodiment, the process gas includes SiH4:$WF_6$ at a ratio of about 2:1 to 4:1. In preferred embodiments, a carrier gas is used. The carrier gas is typically an inert gas such as argon or helium. In preferred embodiments, the carrier gas is argon. Exemplary total flow rates (reactants plus carrier) are between 1000-5000 sccm.

In preferred embodiments, the flash layer is deposited at low temperatures to reduce or eliminate the effect of the tungsten-containing precursor on the substrate. Conventional CVD depositions of tungsten are about 400 C. In preferred embodiments, the CVD deposition of the flash layer takes place at substrate temperatures ranging from about 100-350 C. In specific embodiments, the temperatures range from about 100-300 C, more preferably from about 175-250 C and most preferably at about 200 C. Chamber pressure for the CVD reaction is typically ranges about 1-10 Torr and typical deposition times range from about 0.5-10 seconds.

The thickness of the flash layer depends on the requirements of the application. For most applications, the thickness is between about 10 angstroms-50 angstroms, more preferably from about 10 angstroms-35 angstroms. In applications wherein the flash layer is deposited on silicon for subsequent depositions of layers desired to form a tungsten gate electrode, the thickness of the flash layer is preferably between 50 and 100 angstroms.

Applications

Below are descriptions of various exemplary applications of the present invention. Note that these descriptions are presented only as examples. They are not meant to exclude other applications of the invention. Nor are they meant to exclude the use of the invention from variations or combinations of methods described.

The tungsten flash layer/tungsten nitride deposition methods of this invention may be used in processes for generating tungsten plugs for contact fill in IC wafer fabrication. The tungsten nitride layer serves as a diffusion barrier and adhesion layer for the tungsten contact. The CVD W flash layer may be deposited silicon substrates including silicon (N+ or P+) sources and drains and polysilicon gate electrodes. PNL-WN is then formed over the flash layer. These layers are preferably combined in an integrated contact plug film stack including CVD-W (flash layer)/PNL-W (seed layer)/PNL-WN (barrier-adhesion layer)/PNL-W (nucleation layer)/CVD-W (primary conductor and bulk plugfill). This proposed tungsten plugfill integration scheme is intended to replace the traditional Ti/TiN/W tungsten plugfill film stack. As described in U.S. patent application Ser. No. 10/690,492, referenced above, there are significant advantages to replacing the PVD-Ti/CVD-TiN layers with PNL WN, including significantly reducing manufacturing cost of tungsten plugfill by eliminating Ti-TiN deposition equipment and processing steps, reduction in semiconductor wafer maximum processing temperature requirements, reduction in post-CMP center seam opening (or coring) of tungsten plugs, and reduced thickness and resistivity of liner barrier layer.

In addition to deposition on silicon, PNL WN is deposited on other electrically conductive materials as barrier and/or adhesion layer for direct tungsten plugfill in contact and via applications including metal silicides (such as TiSi, CoSi, NiSi, or $WSi_x$), or other electrically conductive materials. The flash layer may be optimally used on any substrate that is susceptible to attack by tungsten-containing precursors. In addition, the flash layer is not limited to use on substrates that are susceptible to tungsten-precursor attack but may be optimally deposited prior to deposition of tungsten nitride in any application in which it is desirable to reduce the resistivity of the stack.

The tungsten flash layer may also be used prior to depositing tungsten metal film, for example, on top of Ti/TiN in formation of a conventional tungsten plugfill stack. In this manner, the Ti/TiN layer is protected from attack by the tungsten precursor.

In some embodiments, the flash layer may be used prior to deposition of tungsten metal and/or tungsten nitride in the formation of gate electrodes. When used for gate electrode formation, the flash layer is preferably thicker than for the contact applications described above. In preferred embodiments, the flash layer is between 50-100 angstroms when used in gate electrode application.

In some embodiments, the methods of the present invention may be used to provide film stacks with reduced resistivity. Because the resistivity of the tungsten flash layer than the tungsten nitride layer the overall resistivity of the stack is reduced by including the flash layer. For example, resistivity of a 30 angstrom W flash/50 angstrom WN layer is about 300 $\mu\Omega$-cm as compared to 540 $\mu\Omega$-cm for a 50 angstrom WN layer. The resistivity of the tungsten nitride stack is improved without affecting its adhesion.

Deposition Apparatus

The methods of the invention may be carried out in any number of process chambers. Examples include the Novellus Systems Concept 2 Altus chamber, the Novellus Concept 3 Altus processing chamber, or any of a variety of other commercially available CVD tools. In some cases, the reactor contains multiple deposition stations in which parallel reactions can take place. See, e.g., U.S. Pat. No. 6,143,082, which is incorporated herein by reference for all purposes. Thus, in some embodiments, the CVD deposition of the flash layer is performed at a first station that is one of multiple deposition stations provided within a single deposition chamber. If the subsequent tungsten-containing layer is deposited by PNL, the PNL process may be performed at a second station of the multiple stations. This process may take place in parallel at the multiple deposition stations. Alternatively, or in addition, some stations can be reserved for CVD deposition of tungsten at conditions appropriate for the deposition of the flash layer and/or deposition of other tungsten metal layers, while others are reserved for PNL deposition of tungsten nitride. In some embodiments, some stations may be reserved exclusively for depositions of the flash layer. In such cases, CVD flash layer deposition may take place at one station. After the flash layer is deposited, the substrate is moved to another station. PNL deposition of tungsten nitride may take place at one or more stations. After the required PNL cycles are completed to deposit the full thickness of nitride, the substrate is moved to a different station where metallic tungsten is deposited on the new tungsten nitride layer. In one implementation PNL-W and CVD-W are deposited in a process module on a vacuum integrated cluster tool and PNL-WN (including tungsten seed layer formation) is deposited in a dedicated process module.

In other embodiments, the semiconductor substrate is moved between different deposition stations during a single PNL deposition cycle. In this approach, different stations are dedicated to different processes within the cycle. For example, one or two stations might provide reducing agent, one or two other stations might provide tungsten precursor and still other stations might provide nitriding agent. And in some embodiments, certain stations can be reserved for providing dopant precursors. The various stations can also provide for the simultaneous delivery of inert gases with the dedicated gases. Overall, tungsten nitride is deposited by moving wafers from station to station such that the wafer is sequentially exposed to the reducing gases, then the tungsten-containing precursor gases, then nitridation gases, repeatedly until the desired thickness of tungsten is obtained.

In any of these scenarios, the wafers may be indexed from one deposition station to the next to enable parallel wafer processing. Indexing continues until all substrates are coated to the desired thickness. Any number of deposition stations, each capable of having a localized atmosphere isolated from adjacent stations, is possible within the single chamber.

As will be appreciated in the art, each such deposition station will typically have a heated substrate platen for holding and heating a substrate to a predetermined temperature. In addition, each may have a backside gas distribution system to prevent deposition of the W film on the backside of the substrate, and a vacuum clamping manifold for clamping the substrate to the platen. Finally, the deposition chamber can be equipped with a transport system for transporting wafers or substrates into and out of the chamber as well as between deposition stations.

As described U.S. patent application Ser. No. 10/690,492, referenced above, a module containing one or more of the following elements be used for alternating deposition of tungsten nitride and/or stacks comprising tungsten nitride and tungsten (including flash layers):

a plurality of deposition stations comprising a showerhead or dispersion plate for uniform gas introduction paired with a heated pedestal that holds a wafer underneath the showerhead;

a plurality of deposition stations with showerheads flush-mounted with the top of the module vacuum chamber to minimize gas re-circulation in the module and promote efficient purging between alternating deposition steps;

a fully purged top plate of the module vacuum chamber consisting of a purge gas plenum covering the top plate area not occupied by deposition showerheads wherein improved station-to-station isolation and reduced purge times between deposition cycles are obtained; or a vacuum chamber in which the heated pedestals from each deposition station are completely or partially isolated from each other by an annular pumping ring connected to the chamber exhaust. This feature further enhances station-to-station isolation and enables different processes to be run simultaneously on alternate stations in the same module.

The module may further comprise a mechanism, provided to each showerhead, for creating a RF plasma in between the showerheads and the substrate platens. Preferably, such means comprise an RF energy source, a match network, and the necessary electrical connections. In another embodiment, the module may further comprise means for creating a remote plasma in the chamber. Some modules may provide a divert line connected directly to the process vacuum exhaust (pump or vacuum foreline) such that process gasses can bypass the deposition chamber during the time immediately after their respective mass flow controllers (MFCs) are turned on. In addition, the gas delivery system may be provided with a mechanism for controlling the line charge volume. This can be important in precisely timing delivery of nitriding agent, tungsten precursor (e.g., $WF_6$), and/or reducing agent (e.g., $SiH_4$ and $B_2H_6$). With such hardware features, all gases that pulse on and off during PNL can be delivered with a divert and line charge process sequence.

Figure 3:
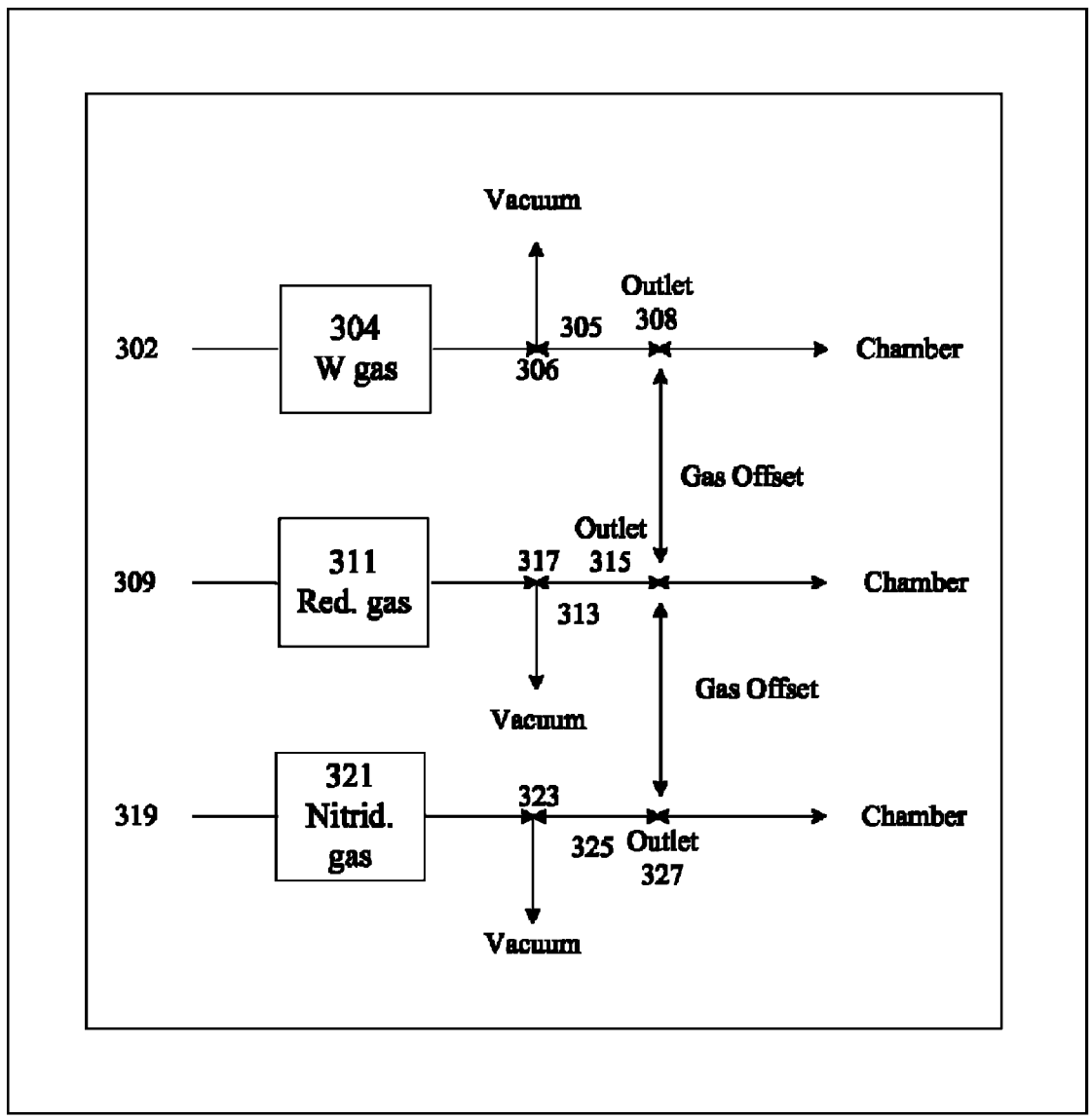
FIG. 3 is a schematic diagram showing the basic features of an apparatus suitable for practicing the current invention.

The invention may be implemented using a gas manifold system, which provides line charges to the various gas distribution lines as shown schematically in FIG. 3. Manifold 304 has an input 302 from a source of the tungsten-containing precursor gas (not shown), manifold 311 has an input 309 from a source of diborane or other reducing gas (not shown) and manifold 319 has an input 321 from a source of nitriding agent (not shown). The manifolds, 304, 311 and 321 provide the tungsten-containing precursor gas, reducing gas and nitriding agent to the deposition chamber through valved distribution lines, 305, 313 and 325 respectively. The various valves are opened or closed to provide a line charge, i.e., to pressurize the distribution lines. For example, to pressurize distribution line 305, valve 306 is closed to vacuum and valve 308 is closed. After a suitable increment of time, valve 308 is opened (valve 315 is closed) and the tungsten-containing precursor gas is delivered to the chamber. After a suitable time for delivery of the gas, valve 308 is closed. The chamber can then be purged to a vacuum by opening of valve 306 to vacuum.

Similar processes are used to deliver the reducing gas and the nitriding agent. To introduce the reducing gas, for example, distribution line 313 is charged by closing valve 315 and closing valve 317 to vacuum. Opening of valve 315 allows for delivery of the reducing gas to the chamber. Similarly, to introduce the nitrding agent, distribution line 325 is charged by closing valve 327 and closing valve 323 to vacuum. Opening of valve 327 allows for delivery of the ammonia or other nitriding agent to the chamber. It has been found that the amount of time allowed for line charges changes the amount and timing of the initial delivery of the gas. Some examples of suitable line charge times are presented below.

FIG. 3 also shows vacuum pumps in which valves 306, 317 and 323, respectively, can be opened to purge the system. The supply of gas through the various distribution lines is controlled by a controller, such as a mass flow controller which is controlled by a microprocessor, a digital signal processor or the like, that is programmed with the flow rates, duration of the flow, and the sequencing of the processes.

If the process employs both a boron-containing reducing agent and a silane reducing agent, there may be two subsystems for the reducing agent: one for the boron-containing reducing agent and another for the silane.

Note that the deposition processes described above may require precise timing of valves and mass flow controllers (MFCs) supplying pulses of reagent to the semiconductor substrate during PNL-WN deposition. In one way to make this possible, valve and MFC commands are delivered to embedded digital input-output controllers (IOC) in discrete packets of information containing instructions for all time-critical commands for all or a part of a PNL deposition sequence. The C2 and C3 ALTUS systems of Novellus Systems, Inc. provide at least one IOC sequence. The IOCs can be physically located at various points in the apparatus; e.g., within the process module or on a stand-alone power rack standing some distance away from the process module. There are typically multiple IOCs in each module (e.g., 3 per module). With respect to the actual instructions included in a sequence, all commands for controlling valves and setting flow for MFCs (for all carrier and reactant gases) may be included in a single IOC sequence. This assures that the timing of all the devices is tightly controlled from an absolute standpoint and also relative to each other. There are typically multiple IOC sequences running at any given time. This allows for, say, PNL to run at stations 1-2 with all timing controlled for all the hardware components needed to deposit PNL-WN at those stations. A second sequence might be running concurrently to deposit CVD-W at other deposition stations in the same module. The relative timing of the devices controlling the delivery of reagents to stations 3-5 is important within that group of devices, but the relative timing of the PNL process at stations 1-2 can be offset from the relative timing of CVD at stations 3-5. An IOC translates the information in a packetized sequence and delivers digital or analog command signals directly to MFC or pneumatic solenoid banks controlling the valves. This implementation reduces delays in command execution at the valve or MFC to as little as 5 ms. Typical control systems in which commands are issued one by one to the IOC are subject to communication delays between the computer controlling module operation and the IOC. Delays in the single-command implementation can exceed 250 ms.

In one example, to achieve good response and repeatability, the nitrding agent flow may be introduced by first enabling flow through a nitriding agent Mass Flow Controller (MFC) and diverting the flow to a process vacuum pump to stabilize flow before introducing the agent into the deposition chamber. To stabilize the nitriding agent flow, the outlet valve 327 is closed while divert valve 323 is open. The manifold system then pressurizes delivery line 325 to assure a controlled initial burst of nitrding agent by closing the divert valve 323 with the process outlet valve 327 closed for between about 0.10 and 3.00 seconds. Next, the system opens the outlet valve 327 to the deposition chamber with the divert valve closed to deliver nitrding agent to the process chamber during deposition. Preferably, all valve timing is controlled using an embedded input-output controller command sequence as described above. The above process may be applied to deposition of tungsten nucleation layers, flash layers, bulk layers, and/or cap layers, using PNL or CVD.

One manifold system sequence for delivering a boron-containing gas (e.g., diborane) to the chamber involves the following operations. First, the system divert a diborane-carrier gas mixture to a vacuum pump for a period of time while the MFC or other flow controlling device stabilizes. Preferably, this is done for between about 0.5 and 5 seconds using a mixture of 5% by volume diborane in a nitrogen carrier gas. Next the system pressurizes the diborane delivery manifold by closing both the divert valve and the outlet to the deposition chamber. In one implementation, this is done for a period of time between about 0.1 to 5 seconds. This creates an initial burst of reagent when the outlet to the deposition chamber is opened. In one implementation, the outlet valve is opened for a period of between about 0.1 to 10 seconds. This is then followed by purging diborane from the chamber using a suitable carrier gas.

A pulse of tungsten-containing gas may be generated as follows. Initially, the system diverts $WF_6$ (an example of the gas) to a vacuum pump for a period of time while the MFC or other flow-controlling device stabilizes. This may be done for a period of between about 0.5 to 5 seconds in one example. Next, the system pressurizes the tungsten gas delivery manifold by closing both the divert outlet 306 and the outlet 308 to the deposition chamber. This may be done for a period of between about 0.1 and 5 seconds, for example, to create an initial burst of reagent when the outlet to the deposition chamber is opened. This is accomplished by opening outlet valve 308 for between about 0.1 and 10 seconds in one example. Thereafter, the tungsten-containing gas is purged from the deposition chamber using a suitable purge gas.

The pulsed flow of silane or other reducing gas may be implemented in a similar manner by controlling divert valve 317 and outlet valve 315. The divert, line pressurization, and flow steps may be timed as presented above for the tungsten-containing gas example. After pulsing with reducing gas for a period of between about 0.1 and 10 seconds, outlet valve 315 is closed and a purge gas is flowed through the chamber.

A listing of hardware elements that may be employed in accordance with the present invention follows. Some of these were identified above.

1) A fully heated and insulated PNL-WN process module such that all internal surfaces are maintained at 100 C or above to avoid condensation of NH4F, a byproduct of the B2H6-WF6-NH3 reaction.
2) A system of gas manifolds such that a single reagent MFC (paired with an inert carrier gas MFC) is split to supply this reagent to multiple deposition stations. This implementation effectively reduces hardware cost by sharing components across multiple deposition stations. It also reduces wafer to wafer and station to station variability by supplying multiple stations from a single source 3) A system with shared reagent manifolds as discussed above (#2) in which each outlet of the manifold to a deposition station is individually valved. This enables the user to select whether or not a given reagent should be delivered to a specific deposition station during a given deposition cycle. This further enhances the ability of the tool to deliver layered films with multiple compositions. For example, the ammonia outlet at the first deposition station may be closed for one or more deposition cycles to promote the growth of a thin tungsten seed (from B2H6-WF6 reaction).

4) Inclusion backside gas delivery hardware to deliver Ar, H2 and NH3 through heated wafer susceptors to the backside of the wafer. The presence of backside ammonia facilitates stoichiometry control across the entire surface of the wafer. Without backside reagent control one or more reagents may be depleted at the wafer edge.

5) Inclusion of a wafer preheat station within a PNL-WN deposition module.

6) Inclusion of a wafer preclean station within a PNL-WN deposition module

7) Inclusion of a reactive wafer preclean module using atomic and/or molecular fluorine to remove native oxides, etch residues, and other contaminants from semiconductor wafer surfaces
   a) Use of an inductively coupled plasma source to dissociate NF3, CF4, C2F6 or other fluorine containing gas as a source for atomic and molecular fluorine.
   b) Using reagent divert and line charge gas handling as described above to precisely control the dose amount of fluorine precursor arriving at the wafer for preclean. Over etch may cause undesirable fluorine attack of delicate structures such as shallow silicide junctions in direct plugfill applications.

8) Inclusion of a total chamber purge such that the majority of the top of the process module not occupied by reagent showerheads actively delivering reagent to semiconductor is actively purged by an inert carrier. In the preferred implementation the process showerheads are embedded in a purge plenum nominally flush with the showerhead face. This configuration can eliminate gas recirculation inside the deposition chamber and dramatically reduce the time required to flush reagent from the chamber. The gas curtain can also enhance station-to-station isolation in a multi-station chamber architecture.

9) Control all time-critical commands to valves and MFC's through an input-output controller (IOC) such that valve timing sequences are delivered to the IOC in a packet sufficiently comprehensive that all the commands for a deposition sequence can be run without pausing to write or read data to the computer controlling the deposition module. By eliminating slow write and read communication the IOC is able to control valve and other device timing within 10-20 ms, which is required for PNL-WN processing due to the short line charge, dose, and purge times required by some sequences.

It is understood that the examples and embodiments described herein are for illustrative purposes only and that various modifications or changes in light thereof will be suggested to persons skilled in the art and are to be included within the spirit and purview of this application and scope of the appended claims. For example, generally, all references to a hollow cathode magnetron can be replaced with references to a general-purpose physical vapor deposition (PVD) reactor. All publications, patents, and patent applications cited herein are hereby incorporated by reference in their entirety.

What is claimed is:

1. A method of forming a tungsten-containing layer on a substrate, the method comprising:
   (a) exposing the substrate to a tungsten-containing precursor and a reducing agent simultaneously to deposit a tungsten flash layer by chemical vapor deposition; wherein the substrate temperature is maintained at a temperature of less than about 350° C. during deposition; and
   (b) depositing the tungsten-containing layer on the flash layer, wherein depositing the tungsten-containing layer on the flash layer comprises exposing the flash layer to a tungsten-containing precursor to thereby deposit a tungsten-containing nucleation or seed layer on the flash layer, wherein the tungsten-containing nucleation or seed layer is a metallic tungsten layer.

2. The method of claim 1 wherein the tungsten flash layer is between about 5-100 angstroms.

3. The method of claim 1 wherein the tungsten flash layer has a thickness between about 10-35 angstroms.

4. The method of claim 1 wherein the substrate comprises exposed silicon and the flash layer is deposited on at least a portion of the exposed silicon.

5. The method of claim 1 wherein the ratio of reducing agent:tungsten-containing precursor in step (a) is between about 2:1 and 4:1.

6. The method of claim 1 further comprising exposing the substrate to the reducing agent for a period of time prior to introducing the tungsten-containing precursor to the chamber.

7. The method of claim 1 wherein the tungsten-containing layer is a tungsten nitride layer.

8. The method of claim 7 wherein tungsten nitride layer is deposited by a pulsed nucleation layer process.

9. The method of claim 7 further comprising, after step (b), forming a metallic tungsten layer over the tungsten nitride layer.

10. The method of claim 1 wherein the tungsten-containing layer is a metallic tungsten layer.

11. The method of claim 1 wherein the substrate temperature is maintained at a temperature of less than about 300 C in step (a).

12. The method of claim 1 wherein the substrate temperature is maintained at a temperature of less than about 250 C in step (a).

13. A method of forming a tungsten nitride layer on a substrate, comprising:
   (a) simultaneously exposing the substrate to reducing agent and a tungsten-containing precursor gases in order to deposit a tungsten flash layer of between about 5 and 100 A on the substrate surface by chemical vapor deposition; and
   (b) depositing a tungsten nitride layer on the flash layer by a pulsed nucleation process, wherein depositing the tungsten nitride layer on the flash layer comprises exposing the flash layer to a tungsten-containing precursor to thereby deposit a tungsten-containing nucleation or seed layer on the flash layer, wherein the tungsten-containing nucleation or seed layer is a metallic tungsten layer.

14. The method of claim 13 wherein the flash layer is between about 5-50 angstroms.

15. The method of claim 13 wherein the flash layer is between about 10-35 angstroms.

16. The method of claim 13 wherein the ratio of reducing agent:tungsten-containing precursor in step (a) is between about 2:1 and 4:1.

17. The method of claim of claim 13 wherein the substrate temperature is between about 100-350 C in step (a).

18. The method of claim 13 wherein the substrate temperature is between about 175-250 C in step (a).

19. The method of claim 13 wherein the substrate comprises exposed silicon and the flash layer is deposited on at least a portion of the exposed silicon.

20. The method of claim 19 further comprising forming a metallic tungsten layer on the tungsten nitride layer to form a silicon contact comprised of the flash layer, the tungsten nitride layer and the metallic tungsten layer.

* * * * *